(12) United States Patent
Kang (10) Patent No.: US 7,656,178 B2
(45) Date of Patent: Feb. 2, 2010

(54) METHOD FOR CALIBRATING SEMICONDUCTOR DEVICE TESTER

(75) Inventor: Jong Koo Kang, Yongin (KR)

(73) Assignee: UniTest Inc., Yongin-si (KR)

( * ) Notice: Subject to any disclaimer, the term of this patent is extended or adjusted under 35 U.S.C. 154(b) by 249 days.

(21) Appl. No.: 11/882,842

(22) Filed: Aug. 6, 2007

(65) Prior Publication Data

US 2008/0231297 A1 Sep. 25, 2008

(30) Foreign Application Priority Data

Aug. 10, 2006 (KR) ............... 10-2006-0075650

(51) Int. Cl.
*G01R 31/02* (2006.01)
*G01R 31/00* (2006.01)
*G01R 31/28* (2006.01)

(52) U.S. Cl. .............. 324/755; 702/89; 714/742
(58) Field of Classification Search ............ None
See application file for complete search history.

(56) References Cited

U.S. PATENT DOCUMENTS

| | | | | |
|---|---|---|---|---|
| 6,060,898 A * | 5/2000 | Arkin | .............. | 324/765 |
| 6,469,514 B2 * | 10/2002 | Okayasu | ............. | 324/763 |
| 6,492,797 B1 * | 12/2002 | Maassen et al. | ......... | 324/74 |
| 6,570,397 B2 * | 5/2003 | Mayder et al. | ........... | 324/754 |
| 6,622,103 B1 * | 9/2003 | Miller | ............ | 702/89 |
| 6,794,861 B2 * | 9/2004 | Maassen et al. | ......... | 324/158.1 |
| 6,882,139 B2 * | 4/2005 | Grebner et al. | ........... | 324/158.1 |
| 6,911,814 B2 * | 6/2005 | Miller et al. | ............ | 324/158.1 |
| 6,979,996 B2 * | 12/2005 | Fleishman | .......... | 324/765 |
| 7,061,260 B2 * | 6/2006 | Frankowsky et al. | ...... | 324/756 |
| 7,106,081 B2 * | 9/2006 | Mayder et al. | ........... | 324/758 |
| 7,489,125 B2 * | 2/2009 | Hauptman | .......... | 324/158.1 |
| 2001/0028251 A1 * | 10/2001 | Okayasu | .......... | 324/532 |
| 2002/0135357 A1 * | 9/2002 | Maassen et al. | ........ | 324/158.1 |
| 2003/0020488 A1 * | 1/2003 | Grebner et al. | .......... | 324/601 |
| 2005/0017708 A1 * | 1/2005 | Miller et al. | ............ | 324/158.1 |
| 2005/0046436 A1 * | 3/2005 | Frankowsky et al. | ...... | 324/765 |

* cited by examiner

*Primary Examiner*—Jermele M Hollington
(74) *Attorney, Agent, or Firm*—Sughrue Mion, PLLC (57) ABSTRACT

A method for calibrating a semiconductor device tester is disclosed. In accordance with method of the present invention, a timing is calibrated using a programmable delay device and calibration boards so as to remove a timing difference between channels and compensate a linearity of the programmable delay device for an adjustment of a timing by building and using a database of the round trip delay actually generated during the test.

11 Claims, 13 Drawing Sheets

Fig. 1

<Prior Art>

Fig. 2

<Prior Art>

Fig. 3

<Prior Art>

METHOD FOR CALIBRATING SEMICONDUCTOR DEVICE TESTER

This is a non-provisional application under 37 C.F.R. § 1.53(b) which claims priority to Korean Patent Application 10-2006-75650 filed of Aug. 10, 2006, which is incorporated herein by reference.

BACKGROUND OF THE INVENTION

1. Field of the Invention

The present invention relates to a method for calibrating a semiconductor device tester, and in particular to a method for calibrating a semiconductor device tester wherein a timing is calibrated using a programmable delay device so as to remove a timing difference between channels and a linearity of the programmable delay device is compensated so as to facilitate an adjustment of the timing.

2. Description of Prior Art

A semiconductor device tester includes a driver for applying a test signal to a DUT (Device under Test) and a comparator for determining a logic of a signal, which corresponds to the test signal, being outputted from the DUT. The driver carries out an output operation of a signal synchronized to an input clock signal. The comparator carries out a comparison operation of a signal synchronized to an input strobe signal.

However, in an initial state of the semiconductor device tester, a timing at which the output signal is outputted from the driver or a comparison timing by the comparator deviates from an expected timing since a difference in a time length of a signal path for each of input/output pins. Therefore, a timing calibration is required prior to carrying out various tests for the DUT.

Figure 1:
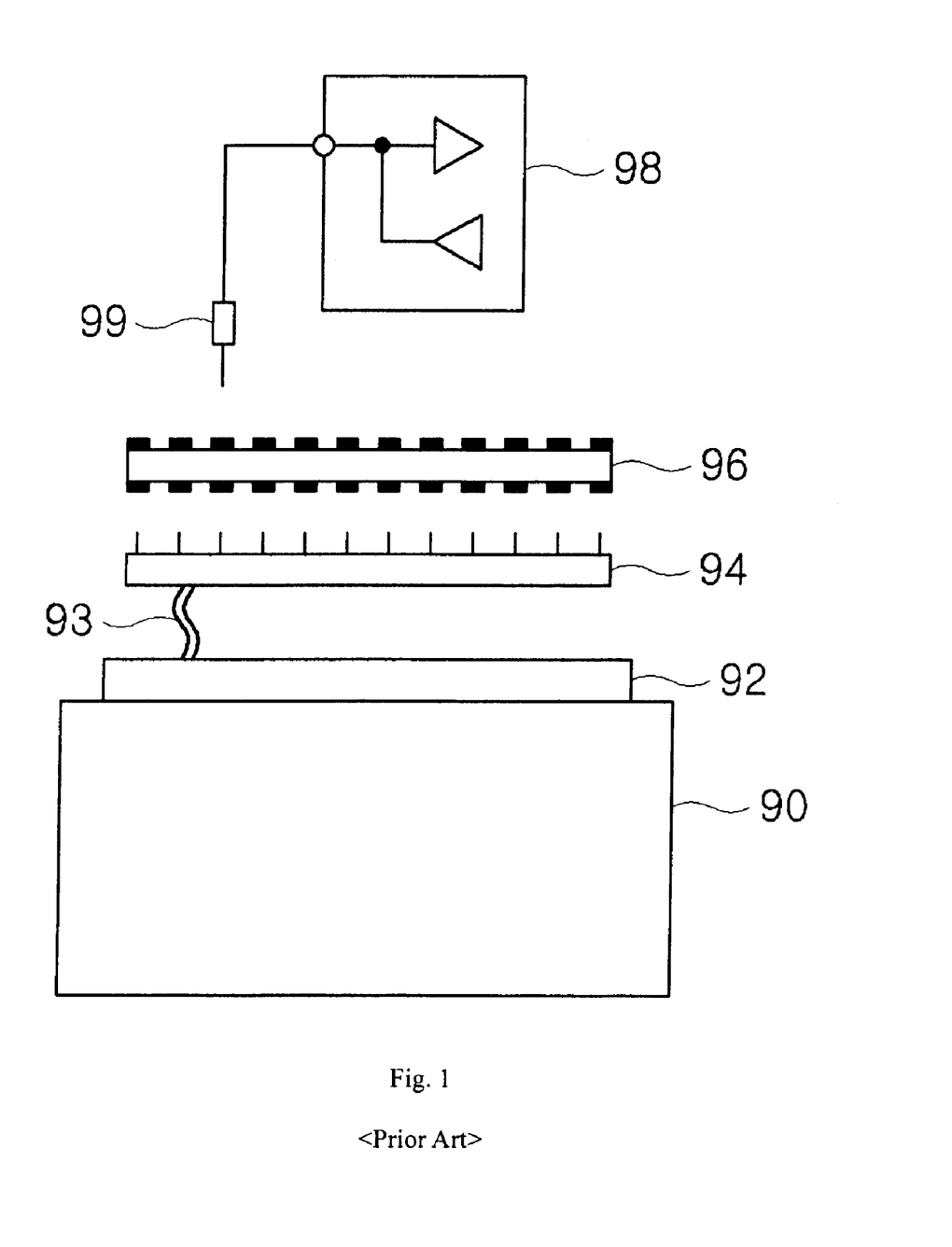
FIG. 1 is a diagram illustrating a conventional configuration for carrying out a timing calibration of a semiconductor device tester.

FIG. 1 is a diagram illustrating a conventional configuration for carrying out a timing calibration of a semiconductor device tester.

Referring to FIG. 1, a main body 90 of the semiconductor device tester is connected to a socket board 94 via a dedicated cable 93. For instance, when various tests for a DUT having a BGA (Ball Grid Array) type package, the socket board 94 having a plurality of pogo pins on a surface thereof is used. A test board 96 is used to facilitate a contact of a probe 99 of a driver/comparator 98 to the plurality of pogo pins installed on the surface of the socket board 94 wherein pads installed on a front and back sides thereof are electrically connected.

Figure 2:
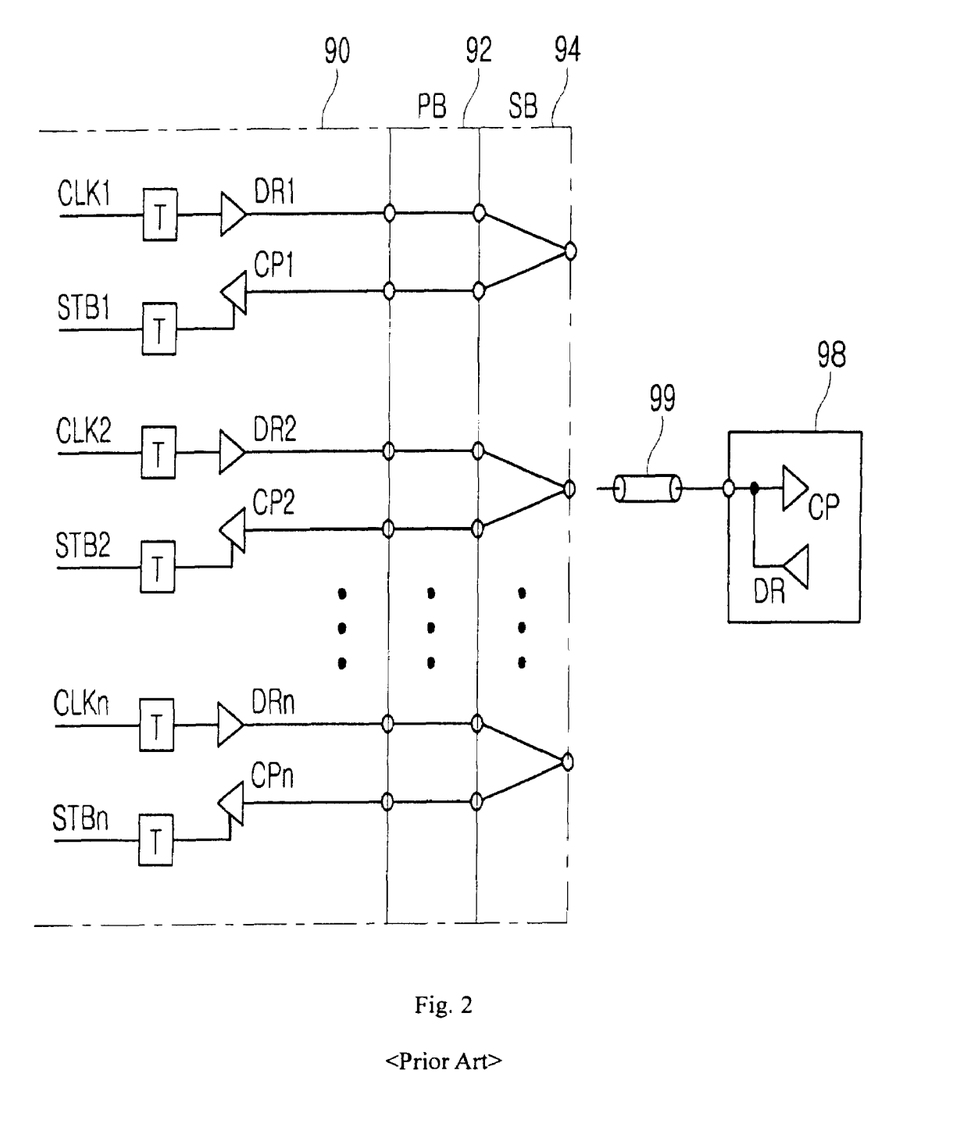
FIG. 2 is a diagram illustrating an electrical layout of the conventional configuration of FIG. 1.

FIG. 2 is a diagram illustrating an electrical layout of the conventional configuration of FIG. 1.

Referring to FIG. 2, the main body 90 of the semiconductor device tester includes a plurality of pairs of the driver and the comparator. Each pair of the driver and the comparator is connected to a common device socket terminal through a performance board 92 and the socket board 94.

Figure 3:
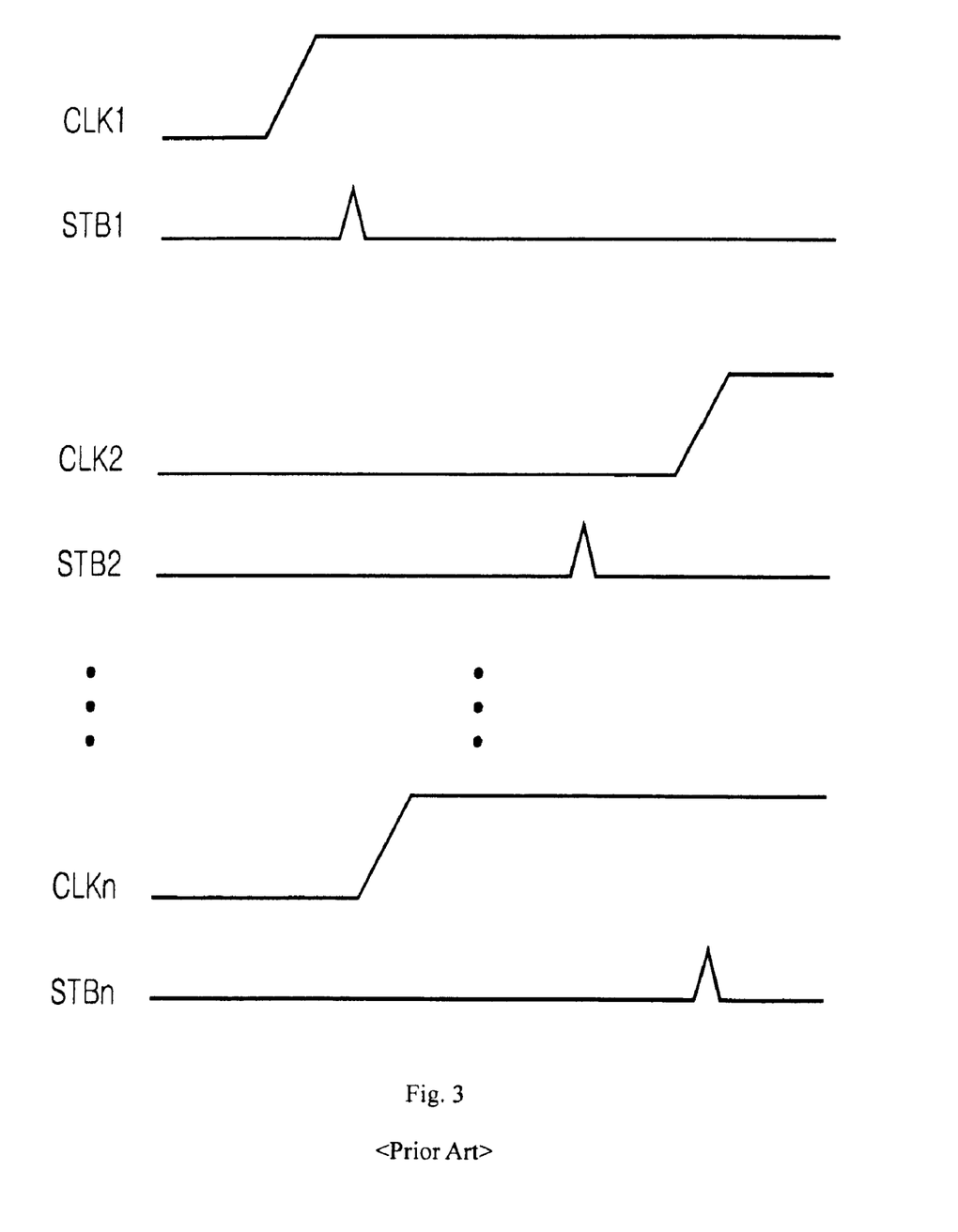
FIG. 3 is a diagram schematically illustrating a conventional timing calibration.

FIG. 3 is a diagram schematically illustrating a conventional timing calibration.

As shown in FIG. 3, in the initial state of the semiconductor device tester, skews of clock signals CLK1 through CLKn being respectively inputted to a plurality of drivers DR1 through DRn and a plurality of comparators CP1 through CPn are inconsistent. Therefore, the inconsistency of the skew is required to be removed.

Moreover, since a round trip delay time required for a signal applied to the semiconductor device tester to return via a signal path exists, the round trip delay time should be reflected when writing a test program.

SUMMARY OF THE INVENTION

It is an object of the present invention to provide a calibration method of a semiconductor device tester wherein a skew generated in the semiconductor device tester is removed and a round trip delay is reflected when programming a test pattern generation program.

There is provided a deskew calibration method for removing a skew of a semiconductor device tester including a plurality of drive channels and a plurality of IO channels for simultaneously testing a plurality of DUTs, the IO channel including a plurality of input channels and a plurality of output channels, the method comprising steps of: (a) aligning a plurality of output signals of the plurality of output channels with reference to a drive signal of one of the plurality of drive channels using a first calibration board wherein the first calibration board connects the one of the plurality of drive channels to the plurality of the output channels; (b) aligning a plurality of drive signals of the plurality of drive channels with reference to the plurality of aligned output signals using a second calibration board wherein second calibration board respectively connects the plurality of drive channels to the plurality of output channels; and (c) aligning a plurality of input signals with reference to the plurality of aligned output signals using a DUT interface board wherein the DUT interface board respectively connects the plurality of input channels to the plurality of output channels.

There is also provided a vernier calibration method for calibrating a semiconductor device tester including a plurality of drive channels and a plurality of IO channels for simultaneously testing a plurality of DUTs, the IO channel including a plurality of input channels and a plurality of output channels, the method comprising steps of: (a) mounting a second calibration board respectively connecting the plurality of drive channels to the plurality of input channels; (b) generating a lookup table for the plurality of drive channels by fixing a delay value of a deskew of the plurality of output channels and varying a delay code value of a deskew of the plurality of the drive channels; (c) generating a lookup table for the plurality of output channels by fixing a delay value of a deskew of the plurality of output channels and varying a delay code value of a deskew of the plurality of the output channels; and (d) mounting a DUT interface board respectively connecting the plurality of input channels to the plurality of output channels; (e) generating a lookup table for the plurality of output channels by fixing the delay value of the deskew of the plurality of output channels and varying a delay code value of a deskew of the plurality of the input channels.

There is also provided a calibration method of a semiconductor device tester including a plurality of drive channels and a plurality of IO channels for simultaneously testing a plurality of DUTs, the IO channel including a plurality of input channels and a plurality of output channels, the method comprising steps of: (a) aligning a plurality of output signals of the plurality of output channels with reference to a drive signal of one of the plurality of drive channels using a first calibration board wherein the first calibration board connects the one of the plurality of drive channels to the plurality of the output channels; (b) aligning a plurality of drive signals of the plurality of drive channels with reference to the plurality of aligned output signals using a second calibration board wherein second calibration board respectively connects the plurality of drive channels to the plurality of output channels; (c) aligning a plurality of input signals with reference to the plurality of aligned output signals using a DUT interface board wherein the DUT interface board respectively connects the plurality of input channels to the plurality of output channels; (d) generating a lookup table for the plurality of drive channels by fixing a delay value of a deskew of the plurality of output channels and varying a delay code value of a deskew of the plurality of the drive channels after mounting the second calibration board; (e) generating a lookup table for the plurality of output channels by fixing a delay value of a deskew of the plurality of output channels and varying a delay code value of a deskew of the plurality of the output channels; and (f) generating a lookup table for the plurality of output channels by fixing the delay value of the deskew of the plurality of output channels and varying a delay code value of a deskew of the plurality of the input channels after mounting the DUT interface board.

DETAILED DESCRIPTION OF THE PREFERRED EMBODIMENTS

The present invention will now be described in detail with reference to the accompanied drawings.

A calibration of a semiconductor device tester may be classified into three types. The three types include a deskew calibration for removing a skew generated in a driver channel and a IO channel, a vernier calibration for determining a program delay according to a round trip delay time obtained by measuring the round trip delay time of a signal path, and a DUT dependent calibration by modeling a DUT interface board and carrying out a calibration accordingly.

A calibration method in accordance with the present invention relates to the three types of calibration methods. Each of the three types of calibration methods will be described in detail below.

1. Deskew Calibration

The semiconductor device tester comprises a test pattern generation board that generates a test pattern signal in order to test a plurality of DUTs and a DUT interface board for mounting N number of DUTs.

A plurality of drive channels that transmits a drive signal to the plurality of DUTs for controlling the plurality of DUTs and a plurality of IO channels for transmitting the test pattern signal to the plurality of DUTs and for reading a data stored in the plurality of DUTs are formed between the pattern generation board and the DUT interface board.

The drive channel does not include a closed loop signal path contrary to the IO channel. The drive signal is transmitted up to an input terminal of the DUT and the drive channel is then terminated. Contrarily, the IO channel wherein various data are stored in the DUT and the stored data are read to determine whether the stored data matches an expected data is comprises an input channel for writing the data in the DUT and an output channel for reading the stored data to be transmitted to a data comparator. That is, the semiconductor device tester writes an input signal IO_DR through the input channel and transmits an output signal IO_CP through the output channel.

A phase difference between the signals transmitted to the DUT is generated since a test of the DUT is carried out via the above-described complex paths. Therefore, a deskew calibration is carried out in order to remove the phase difference.

Figure 4:
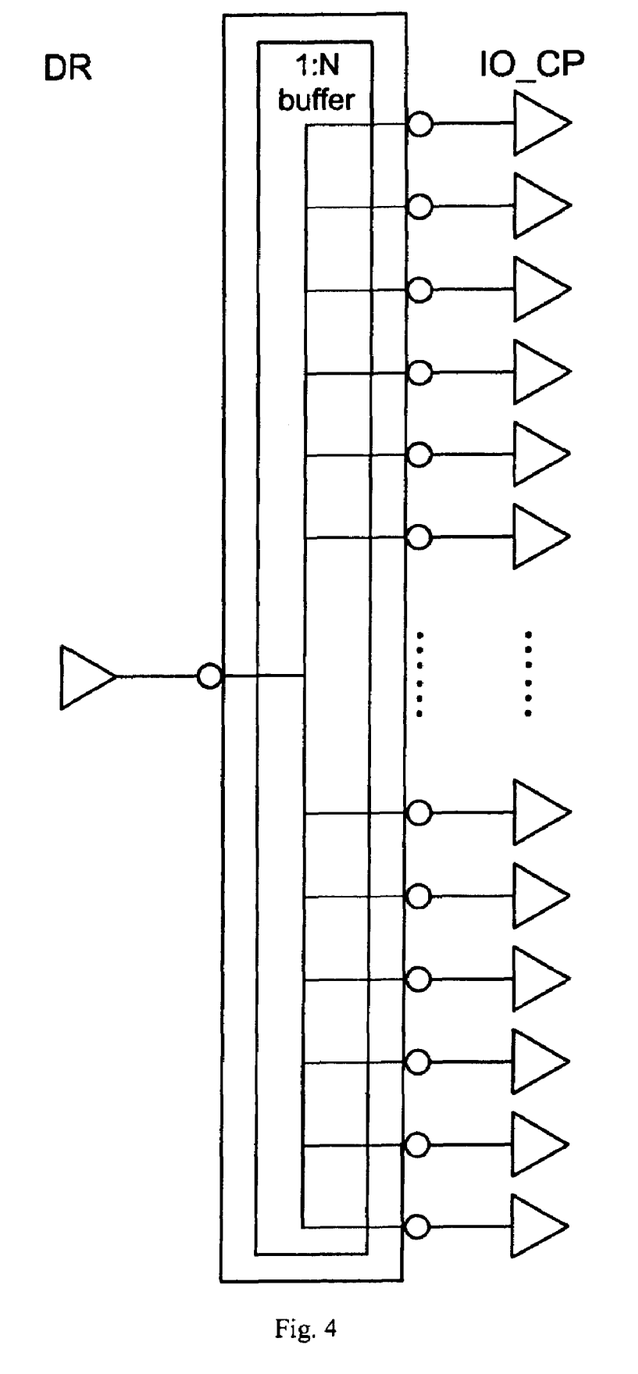
FIGS. 4 through 6 are diagrams illustrating a calibration board and a DUT interface board used in a calibration method of a semiconductor device tester in accordance with the present invention.
Figure 5:
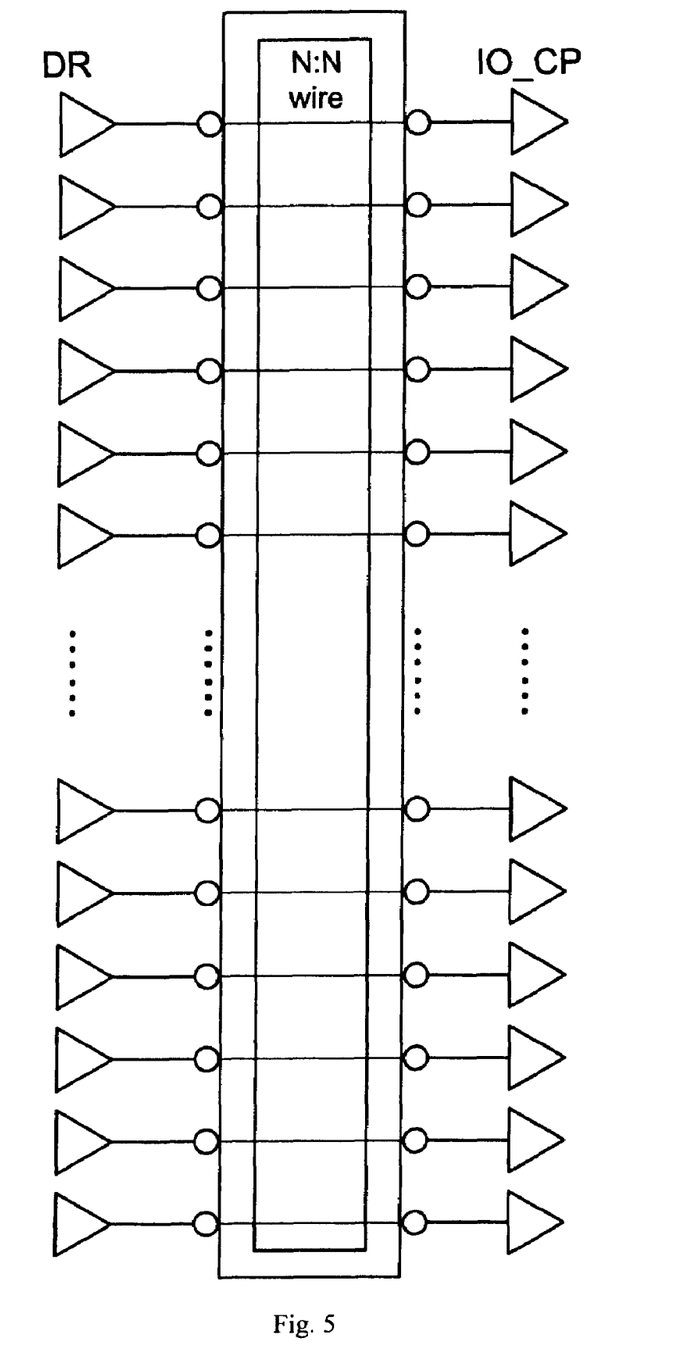
Figure 6:
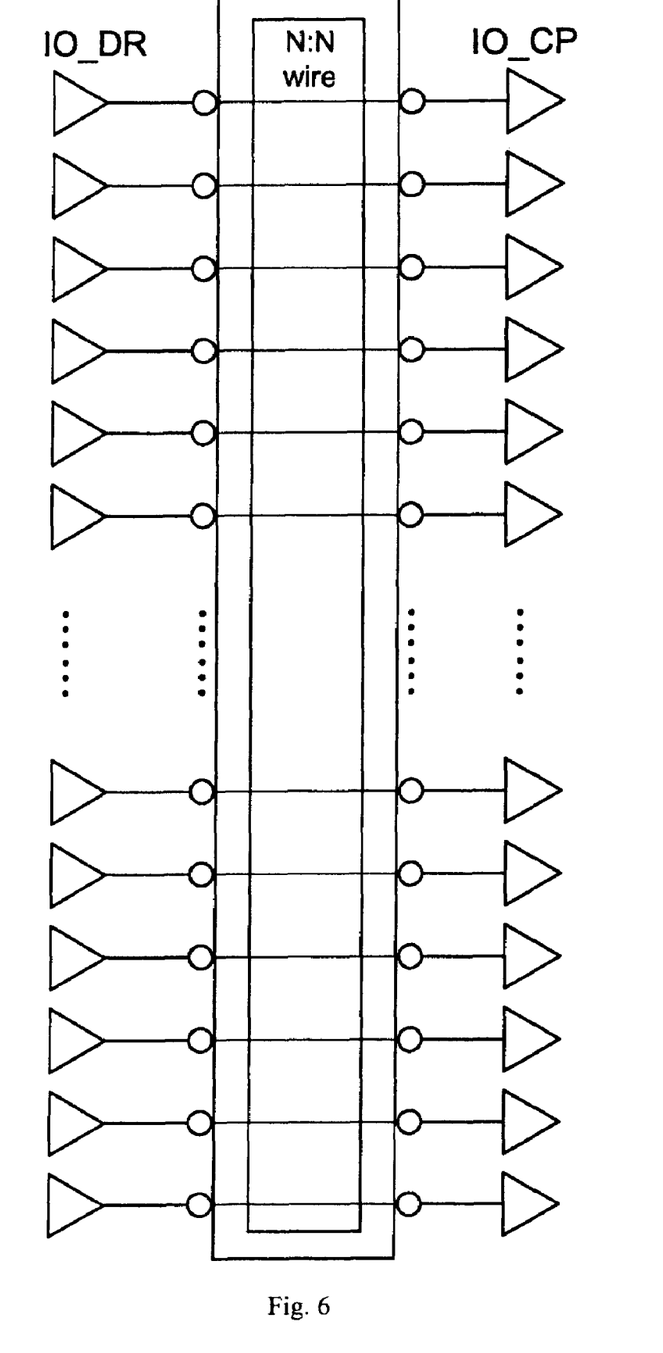

FIGS. 4 and 5 are diagrams illustrating calibration boards used in a calibration method of the semiconductor device tester in accordance with the present invention, and FIG. 6 is a diagram illustrating a DUT interface board used in the calibration method of the semiconductor device tester in accordance with the present invention.

In accordance with the deskew calibration method of the present invention, a calibration is carried out using the first calibration board and the second calibration board shown in FIGS. 4 and 5, and the DUT interface board shown in FIG. 6. Each of the calibration boards is installed instead of the DUT interface board to form a path selected by a user.

First, it is assumed that the plurality of drive channels and the plurality of IO channels are formed between the pattern generation board and the calibration board or the DUT interface board. Each of the IO channels includes the plurality of input channels disposed between the pattern generation board and the calibration board or the DUT interface board, and the plurality of output channels disposed between the calibration board or the DUT interface board and the data comparator.

Figure 7:
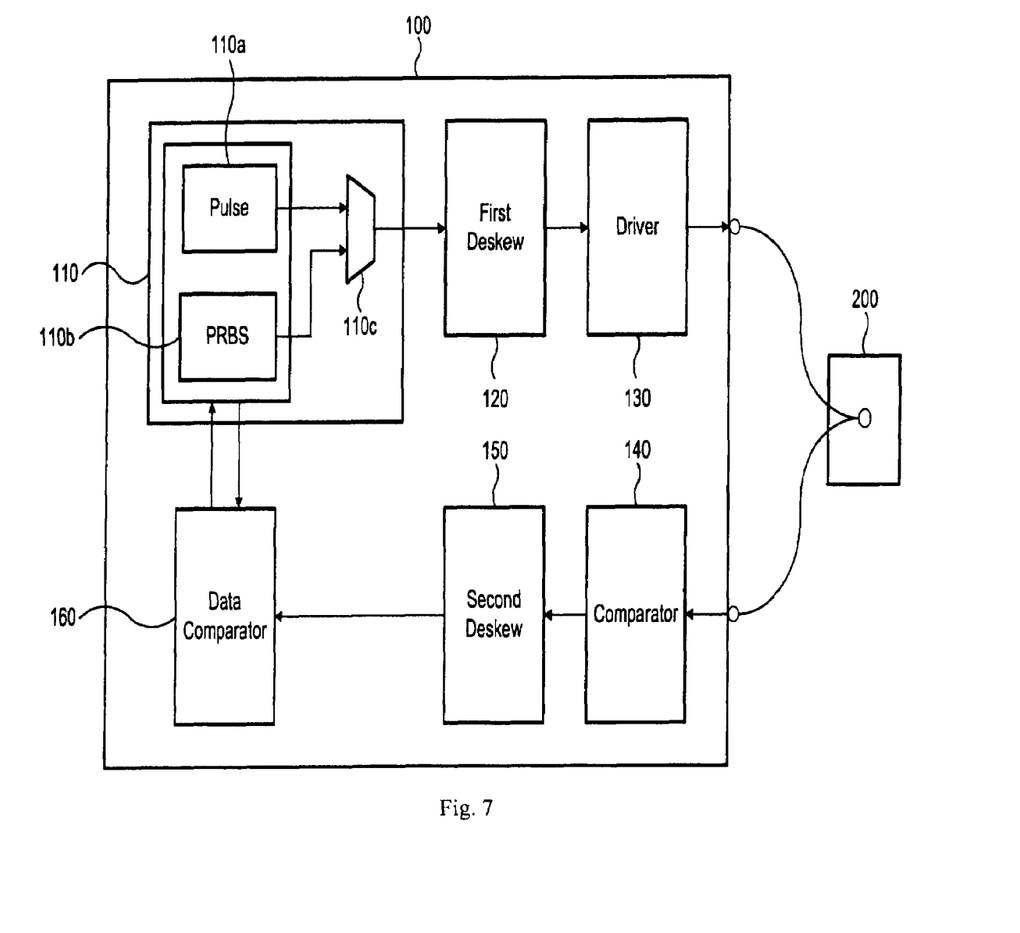
FIG. 7 is a circuit diagram illustrating a data path used in a deskew calibration method of a semiconductor device tester in accordance with the present invention.

The calibration method of the semiconductor device tester in accordance with the present invention is carried out using a circuit shown in FIG. 7. The circuit shown in FIG. 7 illustrates a case wherein a data path required for the calibration is formed installing the calibration board in the semiconductor device tester in accordance with the present invention.

The semiconductor device tester shown in FIG. 7 includes the pattern generation board 100 and the calibration board or the DUT interface board 200. The pattern generation board 100 comprises an ALPG 110 including a pulse signal generator 110$a$ for generating a predetermined pattern and a PRBS signal generator 110$b$ and a MUX 110$c$. While the ALPG 110 generally generates a predetermined test pattern and a drive signal, the ALPG 110 is programmed to generate a pulse signal and a PRBS (Pseudo-Random Bit Sequence) signal to carry out the calibration method in accordance with the present invention. In addition, the pattern generation board 100 comprises a first deskew 120 for removing a skew, a driver 130 for outputting a H logic signal or a L logic signal, a comparator 140 for determining a high and a low of a signal being outputted from the DUT to output the H logic signal or the L logic signal, a second deskew 150 for removing the skew and a data comparator 160 for comparing the expected data and an output data of the DUT.

First, the first calibration board shown in FIG. 4 is loaded in the semiconductor device tester shown in FIG. 7.

As shown in FIG. 4, the first calibration board is configured in a manner that one drive channel selected from the plurality of drive channels is connected to the plurality of output channels by a ratio of 1:N. Therefore, a drive signal DR of the selected drive channel is connected to an output signal IO_CP of the plurality of output channels by the ratio of 1:N.

When the drive signal DR of the selected drive channel is connected to the output signal IO_CP of the plurality of output channels by the ratio of 1:N by loading the first calibration board, the drive signal DR of the selected drive channel is divided by N to be inputted to the plurality of output channels. Since one signal is divided into N number of signals, signals having a same skew are applied to the output channels. Therefore, the signal transmitted to the data comparator 160 via the plurality of output channels theoretically have the same phase. However, the skew is generated while passing through the output channels. In order to remove the skew, the output signal IO_CP is aligned with reference to the drive signal DR of the selected drive channel. That is, the second deskew 150 removes the skew by adjusting the phase difference of each of the output channels in order for the output signal IO_CP to have the same phase immediately before the output signal IO_CP is inputted to the data comparator 160.

Figure 8:
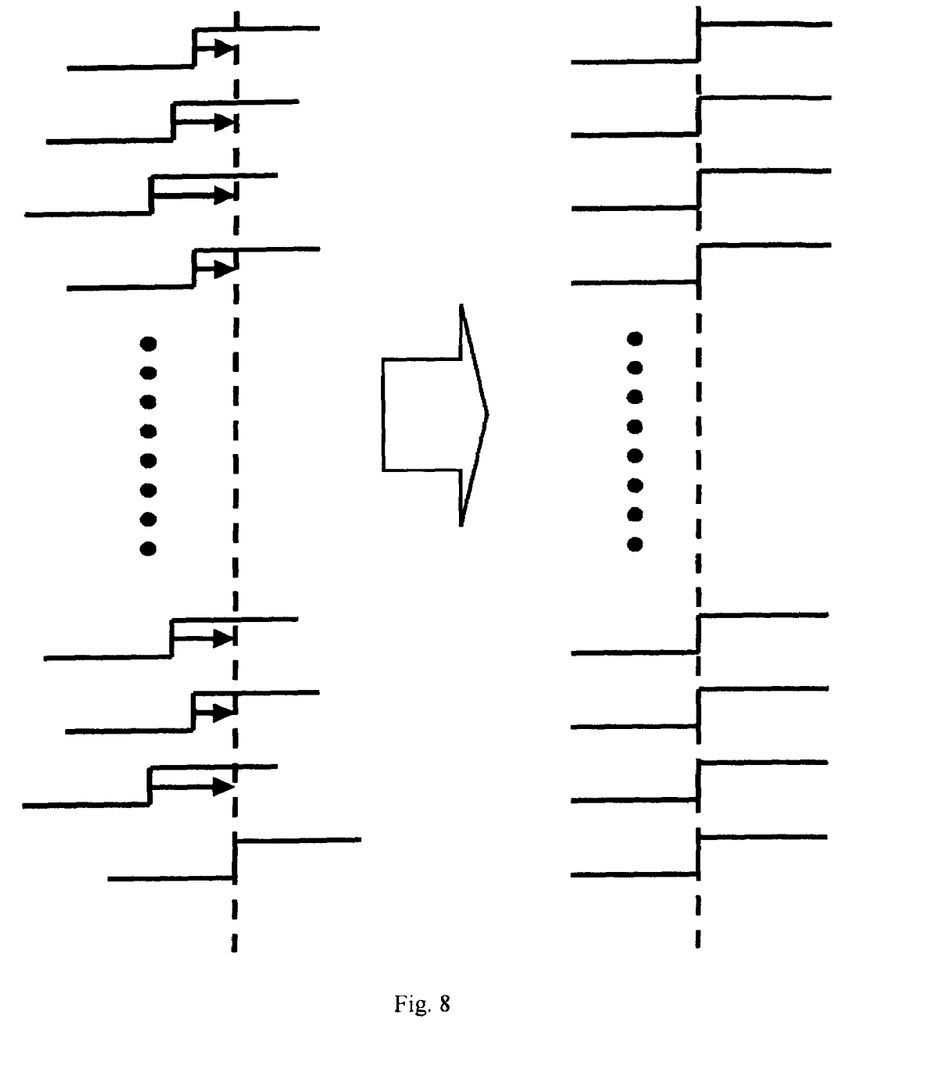
FIGS. 8 and 9 are diagrams illustrating a waveform before and after a deskew calibration method of a semiconductor device tester in accordance with the present invention.
Figure 9:
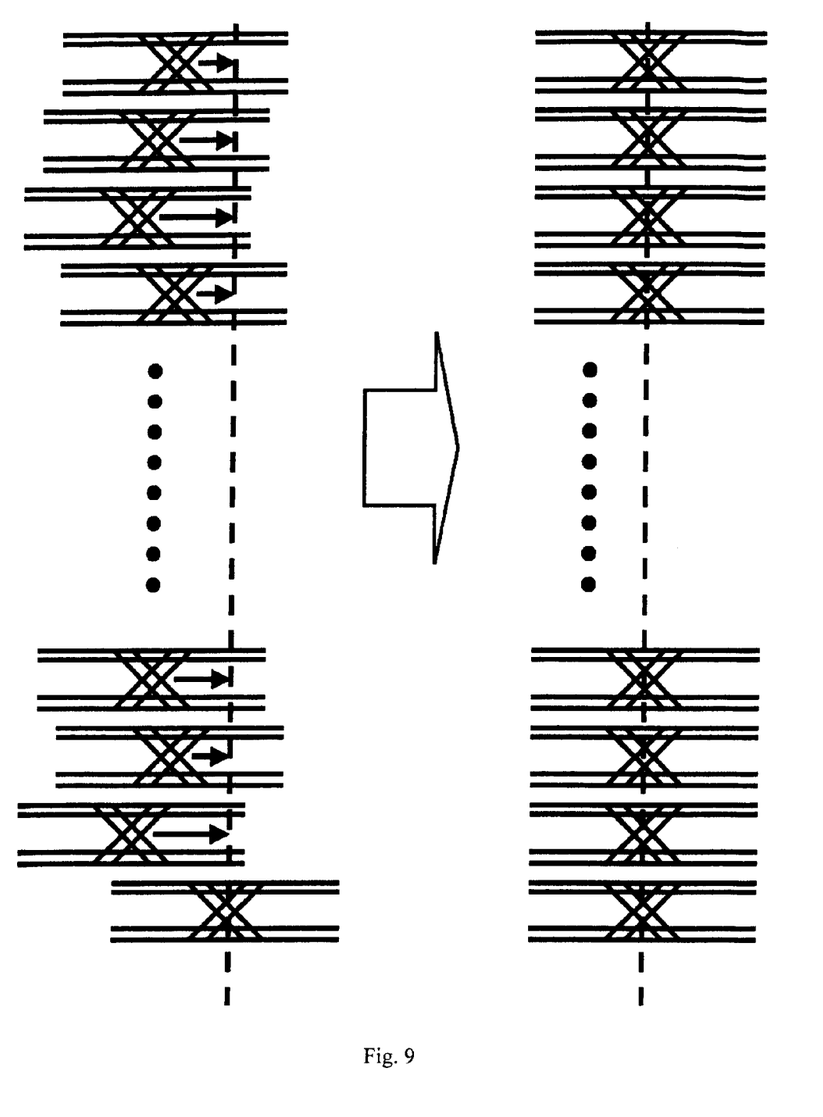

The signal applied to the first calibration board may be the pulse signal or the PRBS (Pseudo-Random Bit Sequence) signal. As shown in FIG. 8, the calibration may be carried out by aligning the output signal IO_CP after applying the pulse signal. In addition, as shown in FIG. 9, the calibration may be carried out by applying the PRBS signal which is similar to a test signal applied during a test of the semiconductor device. The pulse signal and the PRBS signal may be generated by programming the ALPG 110.

When the alignment of the output signal IO_CP is complete, the first calibration board is removed and a second calibration board shown in FIG. 5 is then loaded.

As shown in FIG. 5, the second calibration board is configured in a manner that the plurality of drive channels are connected to the plurality of output channels by a ratio of 1:1. Therefore, the drive signal DR of the drive channels is connected to the output signal IO_CP of the plurality of output channels by the ratio of 1:1.

Since the plurality of the output channels are already aligned, the plurality of drive channels are aligned with respect to the aligned output signals IO_CP. When a signal is applied to the plurality of drive channels and a phase difference generated in the output channels is then measured, a phase difference generated in the drive channels may be detected. Therefore, when the first deskew 120 may be controlled to remove the phase difference, the skew of the drive signal DR of the plurality of drive channels may be removed.

The signal applied to remove the skew of the drive signal DR of the plurality of drive channels may be the pulse signal or the PRBS signal similar to when using the first calibration board.

When the alignment of the drive signal DR is complete, the second calibration board is removed. The DUT interface board shown in FIG. 6 is then loaded. While the DUT interface board is used for an actual test during which the DUTs are mounted therein, the DUTs are not mounted during the calibration. The DUT interface board is configured in a manner that the plurality of input channels are connected to the plurality of output channels by a ratio of 1:1. Therefore, the input signal IO_DR of the plurality of input channels is connected to the output signal IO_CP of the plurality of output channels by the ratio of 1:1.

Since the plurality of the output channels are already aligned, the plurality of input channels are aligned with respect to the aligned output signals IO_CP. When a signal is applied to the plurality of input channels and the phase difference generated in the output channels is then measured, a phase difference generated in the input channels may be detected. Therefore, when the first deskew 120 may be controlled to remove the phase difference, the skew of the input signal IO_DR of the plurality of drive channels may be removed.

The signal applied to remove the skew of the input signal IO_DR of the plurality of drive channels may be the pulse signal or the PRBS signal similar to when using the first calibration board.

The deskew calibration is complete through the above-described process.

2. Vernier Calibration

When the deskew calibration is complete, the phase differences generated in the semiconductor device tester are removed. In an actual test of the semiconductor device, various test signals are applied to carry out the test. A program for generating the various test signals may be programmed such that a user may program a desired delay in the test signals. While the programmed delay is identical to an actual delay in an ideal semiconductor device tester, the programmed delay is not identical to the actual delay in an actual semiconductor device tester. Calculating such difference is referred to as the vernier calibration.

A vernier calibration method in accordance with the present invention will be described in detail below.

Figure 10:
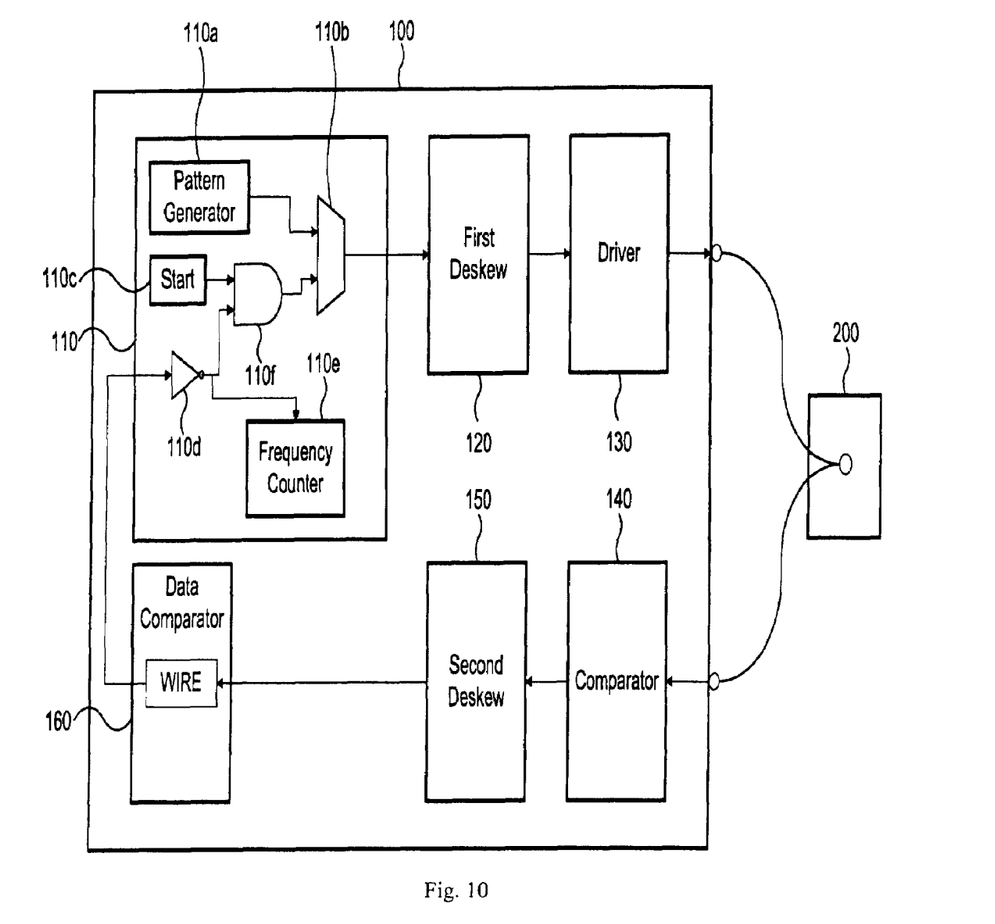
FIG. 10 is a circuit diagram illustrating a data path used in a vernier calibration method of a semiconductor device tester in accordance with the present invention.

FIG. 10 is a circuit diagram illustrating a data path used in the vernier calibration method of the semiconductor device tester in accordance with the present invention.

Referring to FIG. 10, the signal bypasses the data comparator 160 and is inputted to the ALPG 110 contrary to FIG. 7. The ALPG 110 comprises a pattern generator 110a, a start signal generator 110c for generating a start signal, an inverter 110d for inverting an return signal, an AND gate 110f for carrying out an AND operation of the return signal and the start signal, a frequency counter 110e for counting a frequency and a MUX 110b for outputting one of the signals outputted by the AND gate 110f and the pattern generator 110a. Since the ALPG 110 includes a programmable logic device such as an FPGA (Field Programmable Gate Array) for generating a predetermined signal by a programming, the ALPG 110 shown in FIG. 10 may be configured by the programming. Since other components are identical to those shown in FIG. 7, a detailed description is omitted.

The vernier calibration method of the semiconductor device tester in accordance with the present invention is carried out using the second calibration board shown in FIG. 5 and the DUT interface board shown in FIG. 6. As shown in FIG. 5, the second calibration board is configured in a manner that the plurality of the drive channels are connected to the plurality of output channels by the ratio of 1:1. Therefore, the drive signals DR of the drive channels and the output signals IO_CP of the output channels are connected by the ratio of 1:1.

Figure 11:
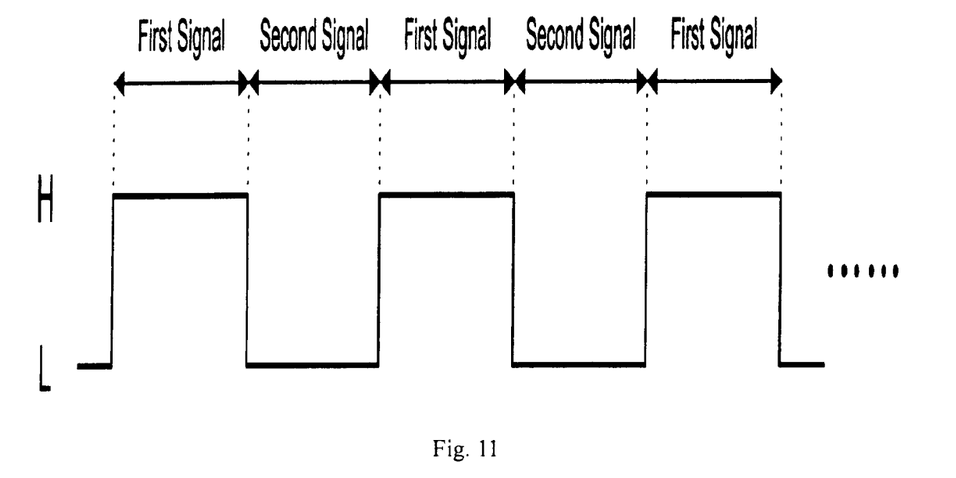
FIG. 11 is a diagram illustrating a waveform of a signal used for a vernier calibration method in accordance with the present invention.

First, the second calibration board 200 is loaded. A first signal having a first logic value and a second signal having a second logic value shown in FIG. 11 are alternately applied from the ALPG 110 to the second calibration board 200. For instance, when the start signal generator 110c generates and outputs the first signal having a logic value of 'H', the first signal passes through the first deskew 120, the driver 130, the second calibration board 200, the comparator 140 and the second deskew 150 and bypasses the data comparator 160 to return to the ALPG 110.

Theoretically, when a delay is not added to the first signal, a first return signal returning to the ALPG 110 should not have any delays. However, in the actual semiconductor device tester, the first return signal includes a round trip delay by passing through various components such as the first deskew 120, the driver 130, the comparator 140 and the second deskew 150.

The first return signal returned to the ALPG 110 is inverted to an inverted signal having a logic value of 'L' by the inverter 110d. The inverted signal is outputted via the AND gate 110f wherein the outputted signal is the second signal having the logic value of 'L'.

The second signal passes through the signal path shown in FIG. 10 to return to the ALPG 110. the returned second signal in inverted and outputted as a signal having the logic value of 'H' via a process similar to that of the first signal.

When above-described processes are repeated, a signal having an increased wavelength by an amount the round trip delay is outputted as a return signal. When a frequency of the return signal is measured using the frequency counter 110e, a wavelength thereof may be obtained, and the round trip delay may be calculated from the wavelength.

When programmed delays added to the first signal is varied to measure actual delays, that is, when delays in a test program is varied to measure the round trip delays, a series of the actual delays may be obtained.

In order to vary the delay of the signal, the test program should be modified. The modification of the test program is carried out by varying a delay code value assigned to each of the delays. For instance, when code values 0, 1, 2 are assigned to delays of 0 ps, 10 ps and 20 ps, respectively, the delay code value may be varied to vary the program delays accordingly by the modification of the test program.

Table 1 illustrates the series of the actual delays according to each of the delay code values.

TABLE 1

| code | frequency | period | delay | DNL |
|------|-----------|--------|-------|-----|
| 0 | 100.00 | 10000 | 0 | 0 |
| 1 | 99.91 | 10009 | 9 | 9 |
| 2 | 99.81 | 10019 | 19 | 10 |
| 3 | 99.73 | 10027 | 27 | 8 |
| 4 | 99.62 | 10038 | 38 | 11 |
| 5 | 99.47 | 10053 | 53 | 15 |
| 6 | 99.34 | 10066 | 66 | 13 |
| 7 | 99.29 | 10072 | 72 | 6 |
| 8 | 99.58 | 10042 | 42 | −30 |
| 9 | 99.49 | 10051 | 51 | 9 |
| 10 | 99.39 | 10061 | 61 | 10 |
| 11 | 99.31 | 10069 | 69 | 8 |
| 12 | 99.21 | 10080 | 80 | 11 |
| 13 | 99.06 | 10095 | 95 | 15 |
| 14 | 98.93 | 10108 | 108 | 13 |
| 15 | 98.87 | 10114 | 114 | 6 |
| 16 | 99.12 | 10089 | 89 | −25 |
| 17 | 99.03 | 10098 | 98 | 9 |
| 18 | 98.93 | 10108 | 108 | 10 |
| 19 | 98.85 | 10116 | 116 | 8 |

Referring to Table 1, the actual delay has a value obtained by subtracting an offset value (that is, the round trip delay when the code value is zero). "DNL" (differential non-linearity) denotes a difference between a current code value and a previous code value, and "frequency" and "period" denote frequencies and periods measured by the frequency counter 110e.

Thereafter, the actual delay closest to the delay to be programmed is selected from the series of the actual delays of Table 1 as shown in Table 2.

TABLE 2

| delay to be programmed | closest delay | code value |
|------------------------|---------------|------------|
| 0 | 0 | 0 |
| 10 | 9 | 1 |
| 20 | 19 | 2 |
| 30 | 27 | 3 |

TABLE 2-continued

| delay to be programmed | closest delay | code value |
|------------------------|---------------|------------|
| 40 | 38 | 4 |
| 50 | 53 | 5 |
| 60 | 66 | 6 |
| 70 | 72 | 7 |
| 80 | 80 | 12 |
| 90 | 89 | 16 |
| 100 | 98 | 17 |
| 110 | 108 | 18 |
| 120 | 116 | 19 |

Referring to Table 2, when the code values are sorted according to the closest delays, the closest delay may be searched by a binary search.

A method for applying the above-described method to each of the channels will be described below in detail.

Firstly, the second calibration board is loaded in the semiconductor device tester. The second calibration board connects the plurality of the drive channels to the plurality of input channels by the ratio of 1:1. When the drive channels and the input channels are electrically connected, a delay value of the deskew of the output channel is fixed and the delay code value of the deskew of the drive channel is varied to generate a look-up table for the drive channel. That is, when the delay value of the deskew of the output channel is fixed and the series of the actual delays is obtained according to the above-described method to generate the look-up table, the look-up table necessary for programming the delay of the drive channels may be obtained.

Thereafter, the delay value of the deskew of the drive channel is fixed and the delay code value of the deskew of the output channel is varied to generate a look-up table for the output channel. That is, when the delay value of the deskew of the drive channel is fixed and the series of the actual delays is obtained according to the above-described method to generate the look-up table, the look-up table necessary for programming the delay of the output channels may be obtained.

Thereafter, the DUT interface board is loaded instead of the second calibration board. The DUT interface board connects the plurality of input channels to the plurality of output channels by the ratio of 1:1. When the plurality of input channels and the plurality of output channels are electrically connected, a delay value of the deskew of the output channel is fixed and the delay code value of the deskew of the input channel is varied to generate a look-up table for the input channel. That is, when the delay value of the deskew of the output channel is fixed and the series of the actual delays is obtained according to the above-described method to generate the look-up table, the look-up table necessary for programming the delay of the input channels may be obtained.

3. DUT Dependent Calibration

In the actual semiconductor device test, various parameters may differ since the calibration board is not used. The DUT dependent calibration compensates for the difference.

Figure 12:
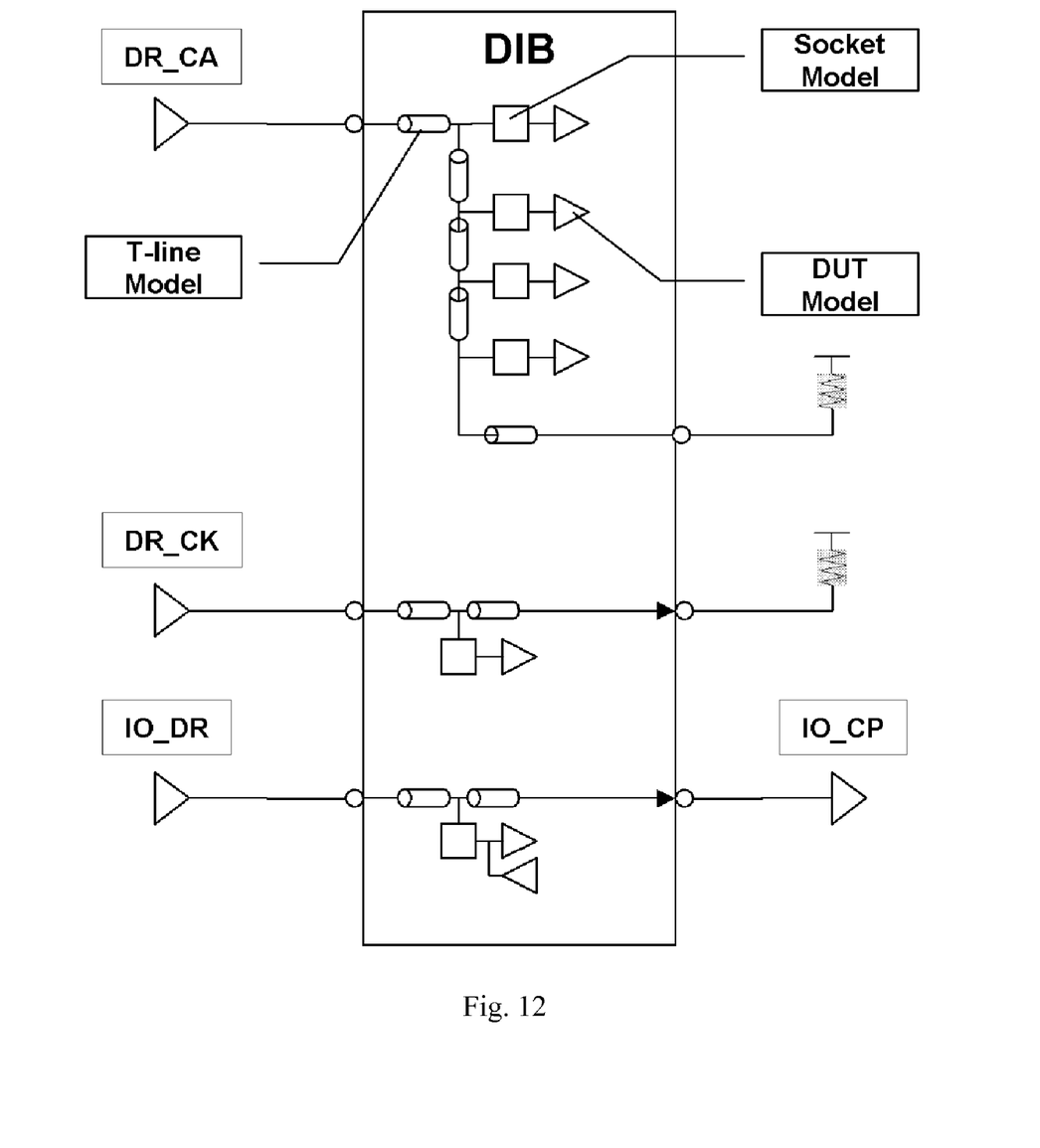
FIG. 12 is a diagram illustrating a DUT-dependent calibration method in accordance with the present invention.

FIG. 12 is a diagram illustrating equivalent circuits of a socket, various signal lines are simulated by a computer. The various signal lines such as a T-line includes a PCB trace and a via and the equivalent circuit thereof is inputted to the computer. Similarly, the equivalent circuits of the socket or the DUT are inputted to the computer. The computer carries out a simulation for the equivalent circuits using a predetermined program, and the user may carry out a calibration for the DUT interface board according to a result of the simulation.

When the calibration through the simulation is finished, the calibration for an entirety of the semiconductor device tester is complete.

4. Calibration According to a Swing of the Input/Output Signals

Figure 13:
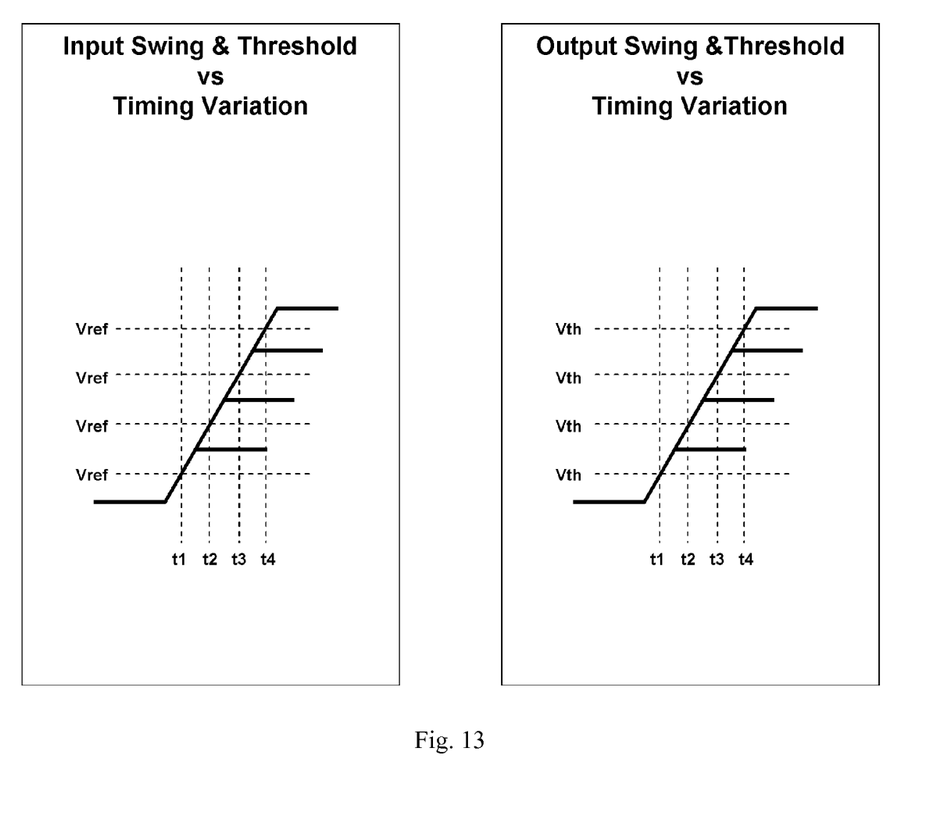
FIG. 13 is a diagram illustrating a timing according to a swing range and a threshold of input/output signals.

FIG. 13 is a diagram illustrating a timing according to a swing range and a threshold of input/output signals.

As shown in FIG. 13, a reference voltage or a threshold voltage varies according to the swing range of the input signal or the output signal, whereby the timing varies accordingly. Therefore, the calibration according to the swing of the input/output signals is necessary.

As described above, the method for calibrating the semiconductor device tester in accordance with the present invention secures the linearity of the programmable delay device by building a database of the round trip delay actually generated during the test and reflecting the round trip delay to test pattern generation program. In addition, the method for calibrating the semiconductor device tester in accordance with the present invention eliminates the phase difference using the calibration board instead of a probe used for the calibration in the prior art.

While the present invention has been particularly shown and described with reference to the preferred embodiment thereof, it will be understood by those skilled in the art that various changes in form and details may be effected therein without departing from the spirit and scope of the invention.

The invention claimed is:

1. A vernier calibration method for calibrating a semiconductor device tester including a plurality of drive channels and a plurality of IO channels for simultaneously testing a plurality of DUTs, the IO channel including a plurality of input channels and a plurality of output channels, the method comprising steps of:
   (a) mounting a second calibration board respectively connecting the plurality of drive channels to the plurality of input channels;
   (b) generating a lookup table for the plurality of drive channels by fixing a delay value of a deskew of the plurality of output channels and varying a delay code value of a deskew of the plurality of the drive channels;
   (c) generating a lookup table for the plurality of output channels by fixing a delay value of a deskew of the plurality of drive channels and varying a delay code value of a deskew of the plurality of the output channels;
   (d) mounting a DUT interface board respectively connecting the plurality of input channels to the plurality of output channels; and
   (e) generating a lookup table for the plurality of input channels by fixing the delay value of the deskew of the plurality of output channels and varying a delay code value of a deskew of the plurality of the input channels.

2. The method in accordance with claim 1, wherein the step (b) comprises:
   (b-1) obtaining an actual delay according to each of the delay code values by varying the delay code of the deskew of the plurality of drive channels;
   (b-2) selecting the actual delay closest to a delay to be programmed in the deskew of the plurality of drive channels; and
   (b-3) generating the lookup table for the plurality of drive channels using the actual delay selected in the step (b-2) and the code value corresponding thereto.

3. The method in accordance with claim 1, wherein the step (C) comprises:
   (c-1) obtaining an actual delay according to each of the delay code values by varying the delay code of the deskew of the plurality of output channels;
   (c-2) selecting the actual delay closest to a delay to be programmed in the deskew of the plurality of output channels; and
   (c-3) generating the lookup table for the plurality of output channels using the actual delay selected in the step (c-2) and the code value corresponding thereto.

4. The method in accordance with claim 1, wherein the step (e) comprises:
   (e-1) obtaining an actual delay according to each of the delay code values by varying the delay code of the deskew of the plurality of input channels;
   (e-2) selecting the actual delay closest to a delay to be programmed in the deskew of the plurality of input channels; and
   (e-3) generating the lookup table for the plurality of input channels using the actual delay selected in the step (e-2) and the code value corresponding thereto.

5. The method in accordance with claim 2, further comprising aligning the delay code values according to the selected actual delay closest to the delay to be programmed.

6. The method in accordance with claim 3, further comprising aligning the delay code values according to the selected actual delay closest to the delay to be programmed.

7. The method in accordance with claim 4, further comprising aligning the delay code values according to the selected actual delay closest to the delay to be programmed.

8. The method in accordance with claim 2, wherein the step (b-1) comprises:
   (b-1-1) alternately applying a first logic value and a second logic value to the second calibration board, the second logic value being an inverted value of the first logic value;
   (b-1-2) measuring a frequency of a return signal including the first logic value and the second logic value having passed through the IO channel; and
   (b-1-3) obtaining the actual delay from the frequency.

9. The method in accordance with claim 3, wherein the step (c-1) comprises:
   (c-1-1) alternately applying a first logic value and a second logic value to the second calibration board, the second logic value being an inverted value of the first logic value;
   (c-1-2) measuring a frequency of a return signal including the first logic value and the second logic value having passed through the IO channel; and
   (c-1-3) obtaining the actual delay from the frequency.

10. The method in accordance with claim 4, wherein the step (e-1) comprises:
   (e-1-1) alternately applying a first logic value and a second logic value to the DUT interface board, the second logic value being an inverted value of the first logic value;
   (e-1-2) measuring a frequency of a return signal including the first logic value and the second logic value having passed through the IO channel; and
   (e-1-3) obtaining the actual delay from the frequency.

11. A calibration method of a semiconductor device tester including a plurality of drive channels and a plurality of IO channels for simultaneously testing a plurality of DUTs, the IO channel including a plurality of input channels and a plurality of output channels, the method comprising steps of:
   (a) aligning a plurality of output signals of the plurality of output channels with reference to a drive signal of one of the plurality of drive channels using a first calibration board wherein the first calibration board connects the one of the plurality of drive channels to the plurality of the output channels;

(b) aligning a plurality of drive signals of the plurality of drive channels with reference to the plurality of aligned output signals using a second calibration board wherein second calibration board respectively connects the plurality of drive channels to the plurality of output channels;

(c) aligning a plurality of input signals with reference to the plurality of aligned output signals using a DUT interface board wherein the DUT interface board respectively connects the plurality of input channels to the plurality of output channels;

(d) generating a lookup table for the plurality of drive channels by fixing a delay value of a deskew of the plurality of output channels and varying a delay code value of a deskew of the plurality of the drive channels after mounting the second calibration board;

(e) generating a lookup table for the plurality of output channels by fixing a delay value of a deskew of the plurality of drive channels and varying a delay code value of a deskew of the plurality of the output channels; and (f) generating a lookup table for the plurality of input channels by fixing the delay value of the deskew of the plurality of output channels and varying a delay code value of a deskew of the plurality of the input channels after mounting the DUT interface board.

* * * * *